United States Patent [19]

Yoshida et al.

[11] 4,288,751

[45] Sep. 8, 1981

[54] WAVE TRANSLATING CIRCUIT

[75] Inventors: Ikio Yoshida; Kouzou Kage; Kazuhiro Ikeda; Yasuo Sato, all of Tokyo, Japan

[73] Assignee: Nippon Electric Co., Ltd., Tokyo, Japan

[21] Appl. No.: 22,648

[22] Filed: Mar. 21, 1979

[30] Foreign Application Priority Data

Mar. 24, 1978 [JP] Japan .................................. 53/34320
Mar. 24, 1978 [JP] Japan ................................ 53/115329

[51] Int. Cl.³ .......................... H03K 5/08; H04N 5/16
[52] U.S. Cl. .................................... 328/173; 307/551; 307/561; 328/159; 328/163; 328/171; 358/173
[58] Field of Search .............. 328/138, 140, 171, 173, 328/159, 163; 320/134; 307/237; 358/40, 171, 173

[56] References Cited

U.S. PATENT DOCUMENTS 3,237,019  2/1966  Fitzgerald .......................... 328/171
3,248,658  4/1966  Brown ............................... 307/237
3,463,940  8/1969  Kaye et al. ......................... 307/237

OTHER PUBLICATIONS

*Pulse, Digital, and Switching Waveforms* by Millman & Taub, Copyright 1965, Chapter 8 "Clamping and Switching Circuits", pp. 262-277.

*Primary Examiner*—John S. Heyman
*Attorney, Agent, or Firm*—Laff, Whitesel & Rockman

[57] ABSTRACT

A wave translating circuit includes a capacitor supplied with an input signal, a first resistor connected between a first potential point and the output of the capacitor, a second resistor connected between a second potential point and the output of the capacitor, and a limiter connected to the output of the capacitor.

3 Claims, 15 Drawing Figures

FIG.8B (i) $\frac{VR5}{R4+R5}$

WAVE TRANSLATING CIRCUIT

The invention relates to a wave translating circuit for supressing transient DC level disturbances of burst data signals generated by a transmitter.

In a transmission system DC level correction of data signals is often conducted, one such example being an adjustment of the operating point of an immediately following amplifier stage.

Several types of wave translating circuits are known, the most widely used of which a high-pass filter circuit comprising a capacitor and a resistor. Although the high-pass filter circuit is simple in construction, the DC components of data signals at the start of transmission and those of burst data signals cannot be removed sufficiently for a certain period due to the transient response of the capacitor. The unremoved portion of the DC components causes overmodulation at the transmitter end of a transmission system and a faulty decision in code regeneration at the receiver end of the transmission system.

It is an object of the present invention to provide a novel wave translating circuit capable of translating the DC components of burst signal waveforms without producing transient disturbances of the DC components.

According to the present invention, there is provided a wave translating circuit, including a capacitor supplied with an input signal, a limiter connected to the output of the capacitor and an adder circuit for adding the output signal of the limiter to the input signal.

According to another aspect of the present invention, there is provided a wave translating circuit including a capacitor supplied with an input signal, a first resistor connected between a first potential point and the output of the capacitor, a second resistor connected between a second potential point and the output of the capacitor, and a limiter connected to the output of the capacitor.

The present invention and its advantages will now be described in detail with reference to the accompanying drawings:

FIGS. 8A and 8B show waveforms at the input (point h) and at the output (point i), respectively, of the wave translating circuit of FIG. 7 and FIGS. 9 and 10 show the third and fourth embodiments according to the present invention, both of which are varieties of the wave translating circuit of FIG. 7.

Figure 1:
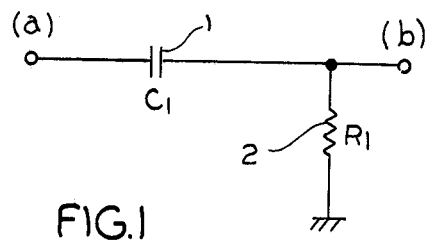
FIG. 1 shows a conventional wave translating circuit (high-pass filter)
Figure 2A:
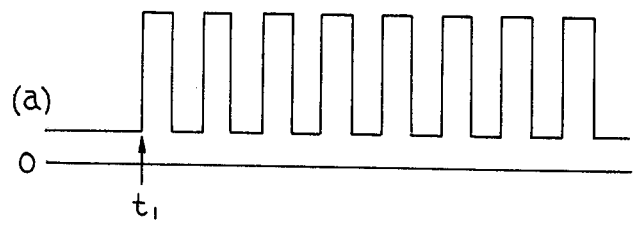
FIGS. 2A and 2B show waveforms at the input (point a) and at the output (point b), respectively, of the wave translating circuit of FIG. 1.
Figure 2B:
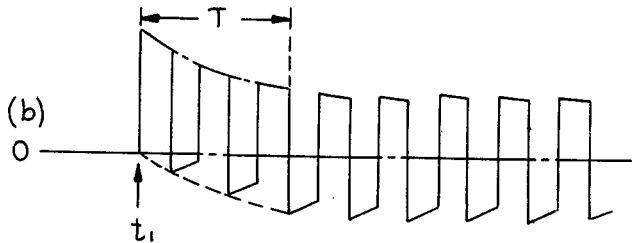

The conventional wave translating circuit (high-pass filter) of FIG. 1 has time constant $C_1R_1$ formed by capacitor 1 (with capacitance value $C_1$) and load resistor 2 (with resistance value $R_1$). The time constant $C_1R_1$ must satisfy $C_1R_1 > \frac{1}{2}\pi f p$, where fp is the bit rate of pulse waveforms. In the case of continuously generated pulse waveforms no problem arises. However, for burst signal waveforms as shown in FIG. 2A, the transient response of capacitor 1 having time constant $C_1R_1$ causes DC component disturbances in output data signals, during the period (T) starting at the instant ($t_1$) of pulse waveform generation as shown in FIG. 2B.

Figure 3:
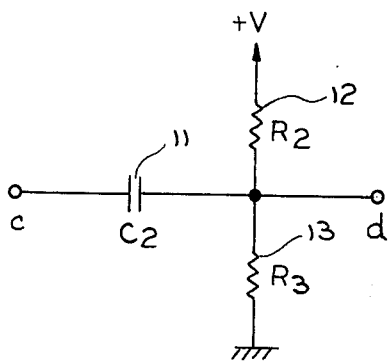
FIG. 3 shows another conventional wave translating circuit.
Figure 4A:
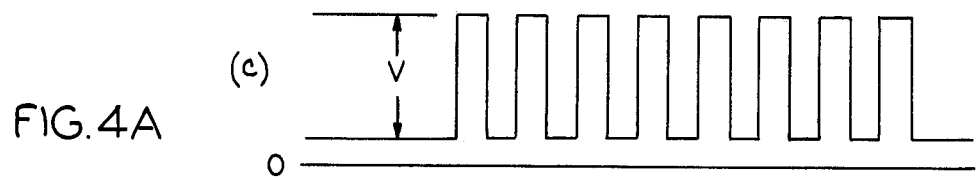
FIGS. 4A and 4B show waveforms at the input (point a) and at the output (point b), respectively, of the wave translating circuit of FIG. 3.
Figure 4B:
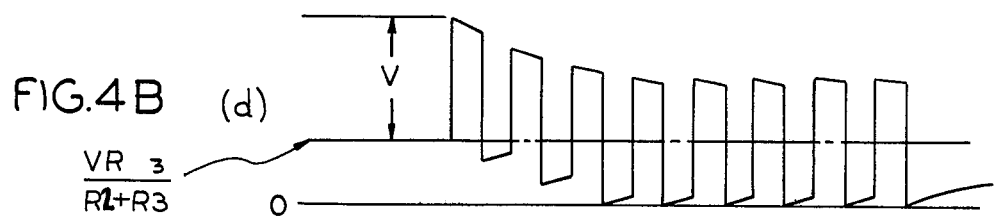

The wave translating circuit of FIG. 3 has a time constant $C_2R_2R_3/(R_2+R_3)$ formed by capacitor 11 (with capacitance value $C_2$) and resistors 12 and 13 (with resistance value $R_2$ and $R_3$, respectively). This time constant must satisfy $C_2R_2R_3/(R_2+R_3) > \frac{1}{2}\pi f p$, where fp is the bit rate of pulse waveforms. In the case of continuously generated pulse waveforms, the DC components of the output voltage in the circuit of FIG. 3 is $VR_3/(R_2+R_3)$ constant, where V is a voltage applied to one end of resistor 12. If, however, burst signal waveforms as shown in FIG. 4A are applied to point C in FIG. 3, the output pulse waveforms shown in FIG. 4B are obtained at point d in FIG. 3. As will be obvious from FIG. 4B, the DC components are disturbed for a certain period starting at the instant of pulse waveform generation, due to the transient response of capacitor 11. If data signals having the DC component disturbances as shown in FIGS. 2B and 4B are modulated with a modulator, overmodulation will result with the consequent faulty decision in a code regeneration at the receiver end.

Figure 5:
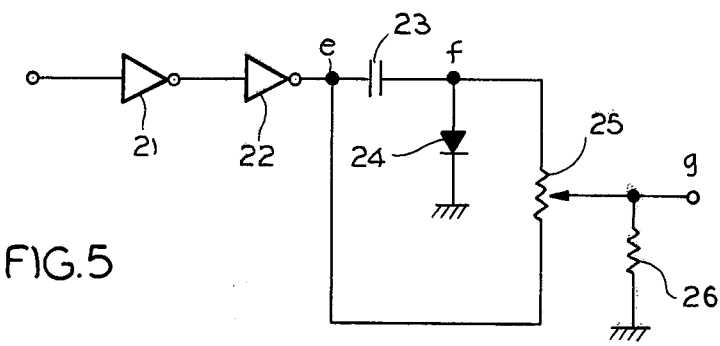
FIG. 5 shows the first embodiment according to the present invention.
Figure 6A:
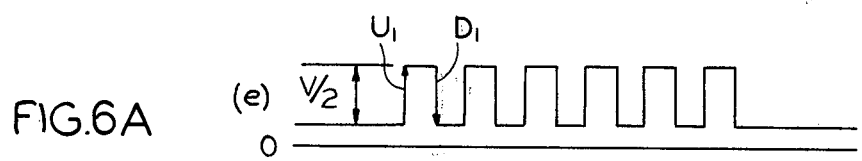
FIGS. 6A, 6B and 6C show waveforms at points e, f and g, respectively, of FIG. 5.
Figure 6B:
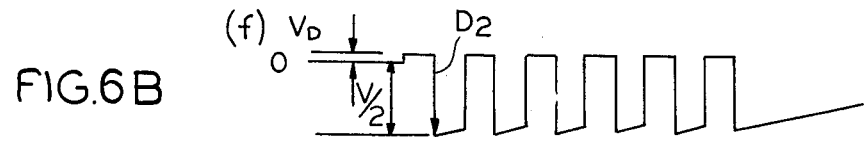
Figure 6C:
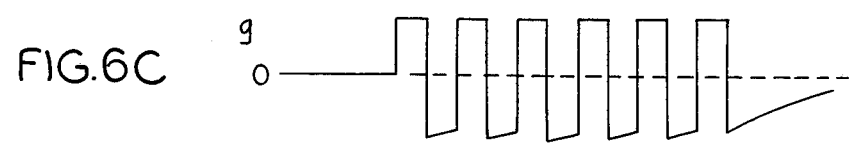

FIG. 5 shows a wave translating circuit, according to the present invention, immediately following waveform shaping inverters 21 and 22. If pulse waveforms in FIG. 6A are applied to the output (point e) of inverter 22, which is in turn the input of the wave translating circuit, the voltage at point e rises by $V/2$ ($U_1$ in FIG. 6A) and hence capacitor 23 is charged in the positive direction. However, because limiter diode 24 conducts, the voltage rise at point f of FIG. 5 is limited to the forward direction voltage $V_D$ of diode 24, as shown in FIG. 6B. On the other hand, when the inverter 22 output voltage at point e falls by $V/2$ ($D_1$ in FIG. 6A), the voltage at point f also falls from level $V_D$ by $V/2$ ($D_2$ in FIG. 6B). Even if burst data signals are applied in succession to point e, as shown in FIG. 6A, the voltage at point f has almost no DC component transient response, as shown in FIG. 6B. If the voltage at point f is added to the output voltage of inverter 22 by means of variable resistor 25, pulse waveforms are obtained having positive and negative polarities, which can be translated by adjusting their amplitude by means of resistor 26 into positive pulse waveforms, with the DC component removed (FIG. 6C). The input data signal in this case is a positive pulse; however, a negative pulse can provide a similar result if the polarity of diode 24 is reversed. It is apparent that variable resistor 25 can be replaced by an adder circuit, such as an operational amplifier.

Figure 7:
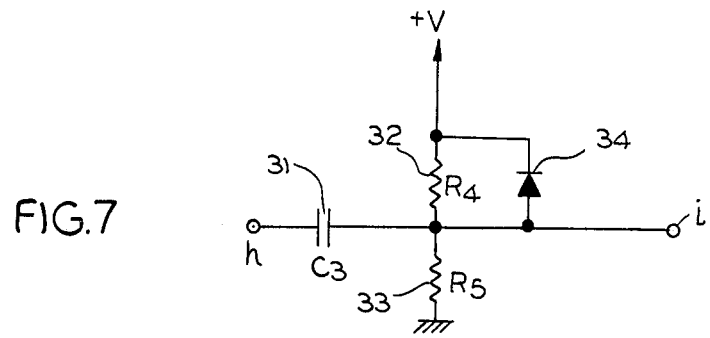
FIG. 7 shows the second embodiment according to the present invention.
Figure 8A:
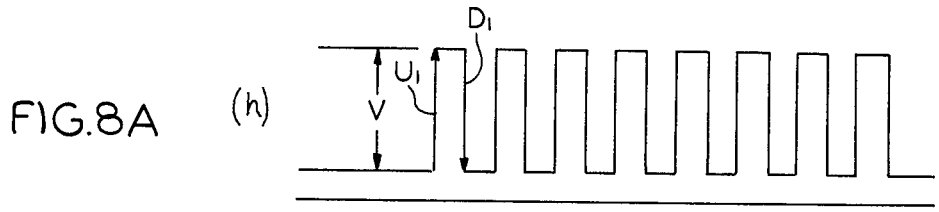

If the voltage at the input (point h) of the wave translating circuit of FIG. 7 rises by V ($U_1$ in FIG. 8A), limiter diode 34 conducts, limiting the output voltage rise at point i to $V+V_D$, where $V_D$ is a forward direction voltage of diode 34 ($U_2$ in FIG. 8B).

Next, if the voltage at point h falls by V, the output voltage also falls by V from $V+V_D$ ($D_1$ and $D_2$ in FIGS. 8A and 8B, respectively).

Even if burst data signals are applied in succession to point h as shown in FIG. 8A, the voltage at point i has almost no DC component transient response as shown in FIG. 8B. The DC component of the output pulses at point i can be given by $VR_5/(R_4+R_5)$, where $R_4$ and $R_5$ are resistance values of resistors 32 and 33, respectively (FIG. 8B).

If, for example, rectangular pulse waveforms having constant amplitude referenced to zero voltage are applied to point h, diode 34 limits the voltage amplitude at their first rise; therefore, almost no DC component transient response occurs at the output (point i).

Figure 9:
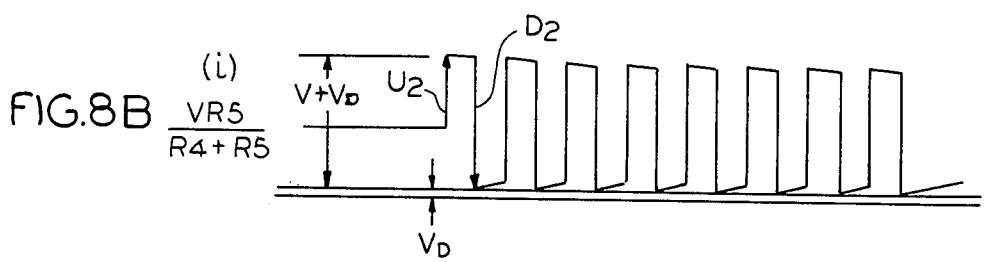
Figure 9:
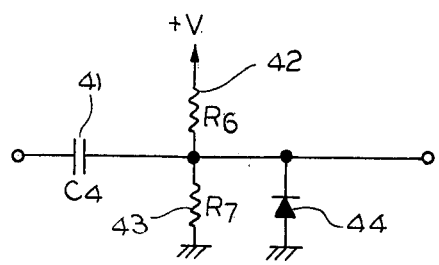

The circuit of FIG. 9, which is a variation of the circuit of FIG. 7, is constructed by capacitor 41 (with capacitance value $C_4$), resistors 42 and 43 (with resistance values $R_6$ and $R_7$, respectively) and diode 44. This circuit can be used where the high level is constant, in the absence of data pulses. If a data pulse train is applied to the input of the circuit, its waveform starts to fall and then diode 44 conducts, limiting the fall of the output voltage to $-V_D$. Therefore, the DC component transient response can be suppressed.

Figure 10:
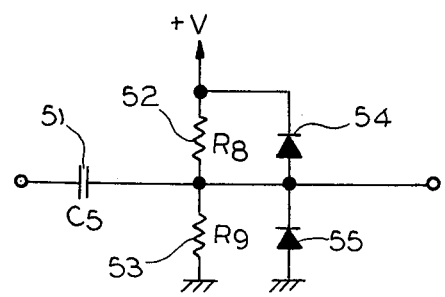

The circuit of FIG. 10 is a combination of the circuits of FIGS. 7 and 9 and includes of capacitor 51 (with capacitance value $C_5$), resistors 52 and 53 (with resistance values $R_8$ and $R_9$, respectively) and diodes 54 and 55. This circuit can be used where high or low voltage levels are constant in the absence of data pulses.

As described in detail above, the wave translating circuits, according to the invention enable the suppression of DC component disturbances due to the transient response of capacitors to burst input signals. Therefore, the wave translating circuits according to the invention can be used very effectively as an interface circuit in a transmission system.

What is claimed is:

1. A wave translating circuit comprising capacitor means supplied with an input signal; limiter means for limiting the output of said capacitor means; and adder circuit means for adding the output of said limiter means to said input signal to produce an output signal from said wave translating circuit.

2. The wave translating circuit as claimed in claim 1, wherein said limiter means comprises a rectifier device connected between the output of said capacitor means and a predetermined potential point.

3. The wave translating circuit as claimed in either claim 1 or claim 2, wherein said adder circuit means comprises variable resistance means having input terminals coupled to the output of said limiter means and coupled to receive said input signal, respectively, and an output terminal coupled to the output of said wave translating means.

* * * * *

UNITED STATES PATENT AND TRADEMARK OFFICE
CERTIFICATE OF CORRECTION

PATENT NO. : 4,288,751

DATED : September 8, 1981

INVENTOR(S) : Yoshida, et al.

It is certified that error appears in the above—identified patent and that said Letters Patent is hereby corrected as shown below:

DRAWINGS:

Fig. 1, insert --(PRIOR ART)-- under "Fig. 1";

Fig. 3, insert --(PRIOR ART)-- under "Fig. 3";

Col. 1, Line 7, after "system" insert a comma --,--;

Col. 1, Line 41, after "detail" insert a comma --,--;

Col. 2, Line 3, after "waveforms" insert a comma --,--;

Col. 3, Line 21, after "includes", delete "of";

Col. 4, Line 2, after "invention" insert a comma --,--.

Signed and Sealed this

Eleventh Day of May 1982

[SEAL]

Attest:

GERALD J. MOSSINGHOFF

*Attesting Officer*     *Commissioner of Patents and Trademarks*